United States Patent
Nakajima

(10) Patent No.: US 7,660,091 B2
(45) Date of Patent: Feb. 9, 2010

(54) OVERCURRENT DETECTING CIRCUIT AND SEMICONDUCTOR DEVICE

(75) Inventor: Sakae Nakajima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 127 days.

(21) Appl. No.: 12/076,404

(22) Filed: Mar. 18, 2008

(65) Prior Publication Data

US 2008/0232017 A1 Sep. 25, 2008

(30) Foreign Application Priority Data

Mar. 22, 2007 (JP) ............... 2007-074943

(51) Int. Cl.
*H02H 3/08* (2006.01)
*H02H 5/04* (2006.01)

(52) U.S. Cl. ..................... 361/93.1; 361/103

(58) Field of Classification Search ............... 361/93.1, 361/103
See application file for complete search history.

(56) References Cited

U.S. PATENT DOCUMENTS

| | | | |
|---|---|---|---|
| 4,945,445 A * | 7/1990 | Schmerda et al. ........... 361/101 |
| 5,018,041 A | 5/1991 | Szepesi |
| 5,459,350 A | 10/1995 | Date et al. |
| 5,519,341 A | 5/1996 | Corsi et al. |
| 5,568,347 A * | 10/1996 | Shirai et al. .................... 361/98 |
| 6,137,668 A * | 10/2000 | Feldtkeller ................. 361/103 |
| 6,154,009 A * | 11/2000 | Fujita et al. ................. 320/134 |
| 6,320,275 B1 * | 11/2001 | Okamoto et al. ........... 307/10.1 |
| 6,351,360 B1 * | 2/2002 | Kotowski et al. ............ 361/103 |
| 6,867,573 B1 * | 3/2005 | Carper ....................... 323/277 |
| 2004/0027759 A1 | 2/2004 | Katoh |
| 2006/0198074 A1 * | 9/2006 | Hirata et al. ................ 361/103 |

(Continued)

FOREIGN PATENT DOCUMENTS

DE 44 29 716 2/1996

(Continued)

OTHER PUBLICATIONS

European Search Report dated Aug. 6, 2008.

*Primary Examiner*—Ronald W Leja
(74) *Attorney, Agent, or Firm*—McGinn IP Law Group, PLLC

(57) ABSTRACT

A highly precise temperature compensation is applied in the detection of overcurrent. A control circuit detects a potential difference produced across a wire owing to the resistance of the wire and a load current that flows into the wire, which connects an NMOS transistor and an output terminal, and controls the NMOS transistor so as to limit the load current if the potential difference exceeds a prescribed value. The control circuit 20 includes a first diode group having a first end from which a first current is passed in a forward direction by a first current source and a second end connected to a first end of the wire, and a second diode group having a first end from which a second current is passed in a forward direction by a second current source and a second end connected to a second end of the wire. The prescribed value is corrected based upon a potential difference across the first ends of the first and second diode groups so as to reduce a change in output-current limit value produced a change in resistance of the metal wire with temperature.

7 Claims, 6 Drawing Sheets

U.S. PATENT DOCUMENTS

2008/0192391 A1 * 8/2008 Inoue .......................... 361/18

FOREIGN PATENT DOCUMENTS

| EP | 0 402 928 | 12/1990 |
|---|---|---|
| JP | 3-48737 | 3/1991 |
| JP | 6-216307 | 8/1994 |
| JP | 11-121683 | 4/1999 |
| JP | 2000-213992 | 8/2000 |
| JP | 2001-267899 | 9/2001 |
| JP | 2004-80087 | 3/2004 |
| WO | WO 96/18109 | 6/1996 |

* cited by examiner

FIG.2A

FOR CURRENT MIRROR RATIO = 1:1

|     | value |     |     |
| --- | --- | --- | --- |
| L   | 1 | | |
| k/q | 0.086 | | mV/°C |
| M/N | 1 | | |
| Y/X | 2 | | |
| R   | 1 | | mΩ |
| tc  | 0.00393 | | /°C |
| T   | -40 | 25 | 125 | °C |
| Ia  | 18.655 | 17.764 | 17.032 | A |

TEMPERATURE COEFFICIENT OF Ia     -0.00041/°C
(FOR TEMPERATURE RISE FROM 25°C TO 125°C)

FIG.2B

FOR CURRENT MIRROR RATIO = 3:1

|     | value |     |     |
| --- | --- | --- | --- |
| L   | 1 | | |
| k/q | 0.086 | | mV/°C |
| M/N | 3 | | |
| Y/X | 2 | | |
| R   | 1 | | mΩ |
| tc  | 0.00393 | | /°C |
| T   | -40 | 25 | 125 | °C |
| Ia  | 48.221 | 45.919 | 44.026 | A |

TEMPERATURE COEFFICIENT OF Ia     -0.00041/°C
(FOR TEMPERATURE RISE FROM 25°C TO 125°C)

FIG.2C

FOR CURRENT MIRROR RATIO = 3:1 AND
TWO SERIALLY CONNECTED DIODES

|     | value |     |     |
| --- | --- | --- | --- |
| L   | 2 | | |
| k/q | 0.086 | | mV/°C |
| M/N | 3 | | |
| Y/X | 2 | | |
| R   | 1 | | mΩ |
| tc  | 0.00393 | | /°C |
| T   | -40 | 25 | 125 | °C |
| Ia  | 96.443 | 91.838 | 88.052 | A |

TEMPERATURE COEFFICIENT OF Ia     -0.00041/°C
(FOR TEMPERATURE RISE FROM 25°C TO 125°C)

OVERCURRENT DETECTING CIRCUIT AND SEMICONDUCTOR DEVICE

REFERENCE TO RELATED APPLICATION

This application is based upon and claims the benefit of the priority of Japanese patent application No. 2007-074943, filed on Mar. 22, 2007, the disclosure of which is incorporated herein in its entirety by reference thereto.

FIELD OF THE INVENTION

This invention relates to an overcurrent detecting circuit and semiconductor device that includes the overcurrent detecting circuit. More particularly, the invention relates to a technique for detecting overcurrent in accordance with a change in the potential of a resistance component of wiring through which an output current flows.

BACKGROUND OF THE INVENTION

Generally, the chassis of a vehicle such as an automobile is at ground potential. For this reason, there are many cases where a load such as a lamp or motor is placed on the low-potential side. Accordingly, heavy use is made of a high-side switch in which the load is connected between the switch and ground. Owing to low ON resistance and low cost, an N-channel MOSFET that performs a source follower operation frequently is used as the switch element.

If an overcurrent flows into the load in the case of such a high-side switch, there is the danger that damage may be inflicted upon the N-channel MOSFET or wiring material serving as the switch element. Accordingly, the general practice is to provide an overcurrent detecting circuit for detecting overcurrent and controlling the current that flows into the N-channel MOSFET. Patent Documents 1, 2 and 3 disclose techniques that use a wire constituting a semiconductor device as an element for detecting current that flows through an N-channel MOSFET in such an overcurrent detecting circuit.

As related art, Patent Document 4 describes a temperature detecting circuit for detecting temperature from a voltage difference utilizing the fact that the temperature coefficient of a voltage difference, which is produced across two diodes, differs depending upon the input current.

[Patent Document 1]
Japanese Patent Kokai Publication No. JP-A-11-121683
[Patent Document 2]
Japanese Patent Kokai Publication No. JP-P2004-80087A
[Patent Document 3]
Japanese Patent Kokai Publication No. JP-A-6-216307
[Patent Document 4]
Japanese Patent Kokai Publication No. JP-P2000-213992A

SUMMARY OF THE DISCLOSURE

The following analyses are given by the present invention. The entire disclosures of the above mentioned patent documents are incorporated herein by reference thereto.

A vehicle-mounted semiconductor device is used over a fairly wide range of temperatures in view of environment in which the device finds use. Accordingly, it is necessary to satisfy conditions required over a wide range of temperatures. A high-side switch is no exception, and it is required that the detected value of overcurrent change little over a wide range of temperatures. The temperature coefficient of electrical resistivity of the metal in wiring used as the current detecting element is about 0.4%/° C. at ordinary temperatures. For example, the temperature coefficient of copper (Cu) is 0.00393/° C. FIG. 6 illustrates an example of a change in the resistance of copper wire with a change in temperature. If the element is used over a temperature range of 100° C., the resistance value of the wire varies by about 40% over this temperature range and this is accompanied by an approximately 40% change in the detected value of overcurrent.

For this reason, there is the danger that detection of overcurrent that is free of fluctuation cannot be carried out over a wide range of temperatures. Patent Document 1 states as follows: "If it is so designed that a reference voltage circuit is afforded a temperature coefficient taking into consideration the temperature coefficient of the resistance of a bonding wire (wiring), then it will be possible to compensate for the temperature characteristic of the detected current value of overcurrent." However, nowhere is a concrete method of compensating for the temperature characteristic described. It is therefore difficult to design a highly precise temperature compensating circuit using a simple circuit arrangement in a vehicle-mounted current detecting circuit.

As a result of assiduous research, the inventor has discovered that a temperature coefficient at a potential difference across two diode groups through which constant currents are passed is the same as the temperature coefficient of electrical resistivity of a metal. Accordingly, the inventor has accomplished the present invention based on the idea that overcurrent detection having an outstanding temperature characteristic can be achieved by so arranging it that a current-limit value of overcurrent that flows into a metal wire is corrected based upon a potential difference across two groups of diodes.

According to a first aspect of the present invention, there is provided an overcurrent detecting circuit. The overcurrent detecting circuit comprises: an output terminal; an output transistor for passing an output current into a load via the output terminal; a metal wire connected to the transistor and through which the output current flows; and a control circuit for detecting a potential difference. The potential difference is produced across both ends of the metal wire owing to the output current that flows into the metal wire and the resistance of the metal wire. The control circuit controls the transistor so as to limit the output current if the potential difference exceeds a prescribed value. The control circuit includes: first and second current sources; a first diode group having a first end from which a first current is passed in a forward direction by the first current source and a second end connected to a first end of the metal wire; and a second diode group having a first end from which a second current is passed in a forward direction by the second current source and a second end connected to a second end of the metal wire. The prescribed value is corrected based upon a potential difference across the first end of the first diode group and the first end of the second diode group so as to reduce a change in output-current limit value ascribable to a change in resistance of the wire with temperature.

According to a second aspect, there is provided a semiconductor device that includes the overcurrent detecting circuit.

The meritorious effects of the present invention are summarized as follows.

In accordance with the present invention, detected voltage of an output-current limit value is corrected so as to reduce a change in the output-current limit value, this being achieved using the fact that a temperature coefficient at a potential difference across two diode groups is the same as the temperature coefficient of electrical resistivity of a metal.

Accordingly, highly precise temperature compensation is performed with a simple circuit arrangement in an overcurrent detecting circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2A to 2C are tables illustrating a change, with temperature, of an output-current limit value of a load current Ia;

PREFERRED MODES OF THE INVENTION

Figure 1:
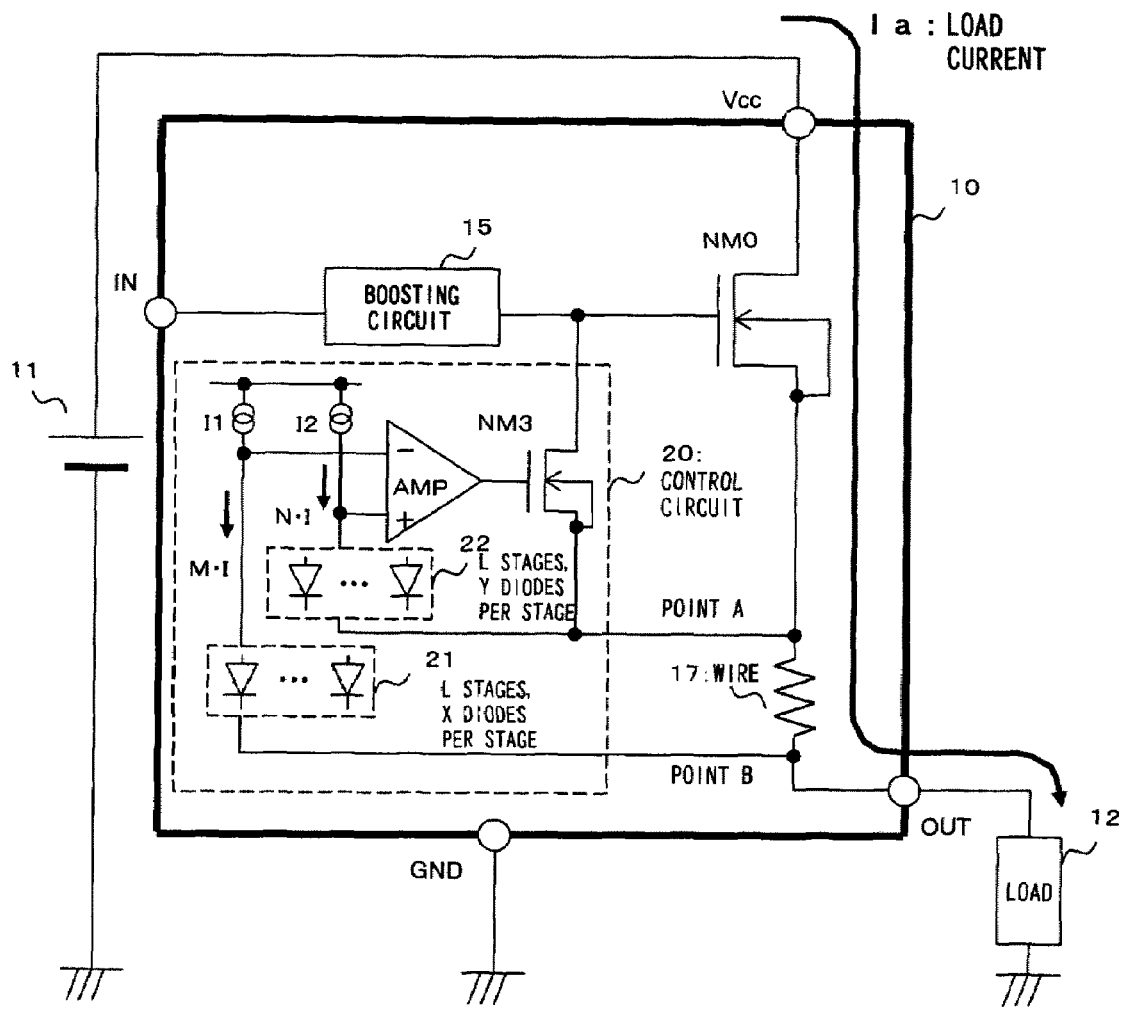
FIG. 1 is a circuit diagram of a semiconductor device according to a first exemplary embodiment of the present invention.

The following modes are preferred in the present invention. The first diode group may have a first diode set having X-number of diode(s), where X is an integer equal to or greater than 1, of parallel-connected diodes constituting one first set in which anodes are connected in common and cathodes are connected in common, with L-number of the first diode set(s), where L is an integer equal to or greater than 1, of the first diode sets being connected serially in a forward direction. A cathode end (a second end) of the first diode group is connected to the first end of the metal wire. The second diode group may have a second diode set having Y-number of diode(s), where Y is an integer equal to or greater than 1, of parallel connected diodes constituting one second set in which anodes are connected in parallel and cathodes are connected in parallel, with L-number of the second diode set(s), where L is equal to that of the first diode group, of the second diode sets being connected serially in a forward direction. A cathode end (a second end) of the second diode group is connected to the second end of the metal wire. It can be so arranged that M·Y/N/X>1 is satisfied, where a potential at the second end of the metal wire is higher than a potential at a first end of the metal wire, and the current-value ratio of the first current source to the second current source is M:N, where M and N are positive integers.

Here, each diode of the first diode set and the second diode set has typically the same structural geometry. In case where X=1, Y=1, the above formula M·Y/N/X>1 become M/N>1, and the values of M and N can be selected so as to satisfy this formula. Alternatively, it is possible to provide different structural geometries (e.g., size) for the diodes of the first diode set and the second diode set so as to satisfy the above formula M·Y/N/X>1. However, the same structural geometry is preferred for achieving high precision.

The control circuit may include: a first MOS transistor having a source, which is connected to an anode end (a first end) of the first diode group, and a drain and gate connected to the first current source; a second MOS transistor having a source connected to an anode end (a first end) of the second diode group, a drain connected to the second current source and a gate connected to the gate of the first MOS transistor; and a third MOS transistor having a gate connected to the drain of the second MOS transistor, a source connected to one of the first and second end of the metal wire and a drain connected to a control end of the output transistor. The first, second and third MOS transistors can be of the same conductivity type, and the third MOS transistor controls the output transistor so as to limit the output current if the potential difference exceeds the prescribed value.

The output transistor may be an NMOS transistor that functions as one of a high-side switch and a low-side switch.

A semiconductor device may include the overcurrent detecting circuit aforementioned. In the semiconductor device, the first and second diode groups are placed close to the metal wire. In the semiconductor device, the metal wire may be a bonding wire consisting of copper, silver, gold, aluminum or an alloy having at least one of these metals as a main component. The output terminal may be an outer lead portion of a lead frame to which the bonding wire is connected.

Preferred exemplary embodiments of the present invention will now be described in detail with reference to the drawings.

An overcurrent detecting circuit according to an exemplary embodiment of the present invention includes: an output terminal OUT (FIG. 1); an output transistor NM0 (FIG. 1) for passing an output current Ia (FIG. 1) into a load 12 (FIG. 1) via the output terminal; a metal wire 17 (FIG. 1) connected to the output transistor and through which the output current flows; and a control circuit 20 (FIG. 1) for detecting a potential difference, which is produced across both ends of the metal wire owing to the output current that flows into the metal wire and the resistance of the metal wire, and controlling the output transistor so as to limit the output current if the potential difference exceeds a prescribed value. The control circuit 20 (FIG. 1) includes first and second current sources I1 and I2 (FIG. 1); a first diode group 21 (FIG. 1) having first ends from which a first current is passed in a forward direction by the first current source and second ends connected to a first end of the metal wire; and a second diode group 22 (FIG. 1) having first ends from which a second current is passed in a forward direction by the second current source and second ends connected to a second end of the metal wire. The prescribed value is corrected based upon a potential difference across the first ends of the first and second diode groups so as to reduce a change in output-current limit value ascribable to a change in resistance of the metal wire with temperature.

Preferably, the first diode group has X-number (where X is an integer equal to or greater than 1) of parallel-connected diodes constituting one set in which anodes are connected in common and cathodes are connected in common, L-number (where L is an integer equal to or greater than 1) of the diode sets being connected serially in the forward direction and cathode ends of the diodes being connected to the first end of the metal wire. The second diode group has Y-number (where Y is an integer equal to or greater than 1) of diodes constituting one set in which anodes are connected in parallel and cathodes are connected in parallel, L-number of the diode sets being connected serially in the forward direction and cathode ends of the diodes being connected to the second end of the metal wire. It is so arranged that M·Y/N/X>1 holds, where the potential at the second end of the metal wire is higher than the potential at the first end of the metal wire, and the current-value ratio of the first current source to the second current source is M:N (where M and N are positive integers).

Figure 4:
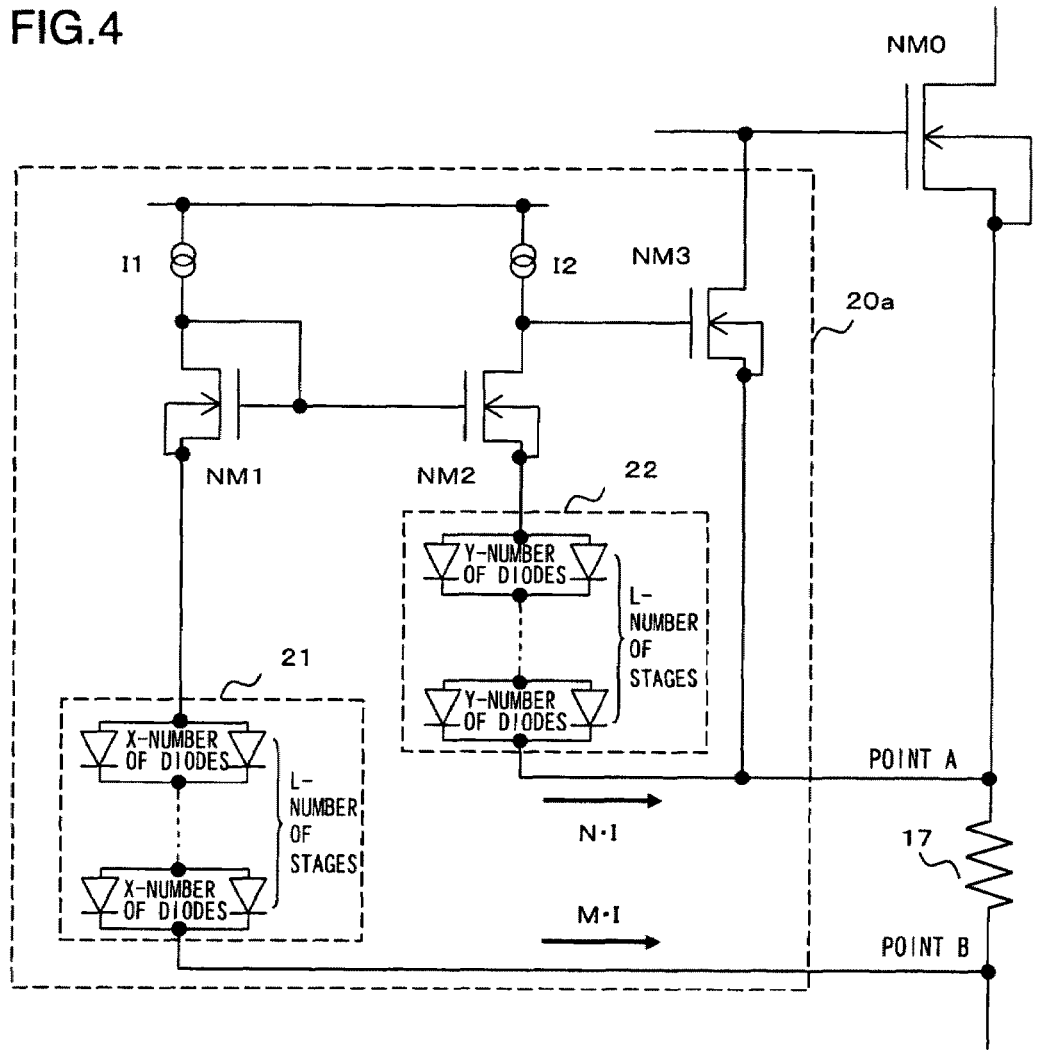
FIG. 4 is a circuit diagram of an overcurrent detecting circuit according to a second exemplary embodiment of the present invention.

Preferably, the control circuit includes: a first MOS transistor NM1 (FIG. 4) having a source, which is connected to the anode ends of the first diode group, and a drain and gate connected to the first current source; a second MOS transistor NM2 (FIG. 4) having a source connected to anode ends of the second diode group, a drain connected to the second current source and a gate connected to the gate of the first MOS transistor; and a third MOS transistor NM3 (FIG. 4) having a gate connected to the drain of the second MOS transistor, a source connected to the first or second end of the metal wire and a drain connected to a control end of the output transistor NM0 (FIG. 4). The first, second and third MOS transistors are of the same conductivity type, and the third MOS transistor controls the output transistor so as to limit the output current if the potential difference exceeds the prescribed value.

The output transistor may be an NMOS transistor that functions as a high-side switch or low-side switch.

A semiconductor device according to an exemplary embodiment of the present invention includes the overcurrent detecting circuit described above. It is preferred that the first and second diode groups be placed close to the metal wire in the semiconductor device. Further, the metal wire may be a bonding wire consisting of copper, silver, gold, aluminum or an alloy having at least one of these metals as a main component. The output terminal may be a lead frame to which the bonding wire is connected.

Exemplary embodiments of the invention will now be described with reference to the accompanying drawings.

First Exemplary Embodiment

FIG. 1 is a circuit diagram illustrating a semiconductor device 10 according to a first exemplary embodiment of the present invention. The semiconductor device 10 has terminals Vcc, IN, GND and OUT, an NMOS transistor NM0, a boosting circuit 15, a wire 17 and a control circuit 20. When an ON signal is applied to the terminal IN, the boosting circuit 15 impresses a boosted voltage upon the gate of the NMOS transistor NM0. The NMOS transistor NM0 to the gate of which the boosted voltage has been applied turns on so that a load current (output current) Ia supplied from a battery 11 is output from the terminal OUT and supplied to a load 12 via the terminal Vcc, drain and source of the NMOS transistor NM0 and wire 17.

The control circuit 20 has diode groups 21, 22, current sources I1, I2, an amplifier AMP and an NMOS transistor NM3. The diode group 21 has first ends (the anode side) from which a first current is passed in a forward direction by the current source I1 and second ends (the cathode side) connected to a first end (point B) of the wire 17. The diode group 22 has first ends (the anode side) from which a first current is passed in a forward direction by the current source I2 and second ends (the cathode side) connected to a second end (point A) of the wire 17. It is assumed that the current values in the current sources I1, I2 are so small as to be negligible in comparison with the current value of the load current Ia. The amplifier AMP has an inverting input terminal (−) connected to the first ends (anode side) of the diode group 21, a non-inverting input terminal (+) connected to the first ends (anode side) of the diode group 22, and an output terminal connected to the gate of the NMOS transistor NM3. The NMOS transistor NM3 has a drain connected to the gate of the NMOS transistor NM0 and a source connected to the second end (point A) of the wire 17, namely to the source of the NMOS transistor NM0.

In a case where the value of the load current Ia is within a normal range in the semiconductor device constructed as set forth above, the potential difference across the ends (points A and B) of the wire 17 is small and the potential at the first ends (anode side) of the diode group 22, namely the potential at the non-inverting input terminal of the amplifier AMP, is lower than the potential at the first ends (anode side) of the diode group 21, namely the potential at the inverting input terminal of the amplifier AMP. Accordingly, the potential at the output of the amplifier AMP declines, the NMOS transistor NM3 turns off and operation of the NMOS transistor NM0 is unaffected.

On the other hand, if the load current Ia exceeds an output-current limit value, the potential difference across the ends (points A and B) of the wire 17 exceeds a prescribed value. If the potential difference exceeds the prescribed value, the control circuit 20 controls the gate of the NMOS transistor NM0 so as to limit the load current Ia. More specifically, if the potential at the first ends (anode side) of the diode group 22 becomes higher than the potential at the first ends (anode side) of the diode group 21, then the potential at the output terminal of the amplifier AMP rises. As a result, the potential difference across the gate and source of the NMOS transistor NM3 increases, the potential at the drain of the NMOS transistor NM3, namely the potential at the gate of the NMOS transistor NM0, falls and the load current Ia that flows through the NMOS transistor NM0 is limited.

Described next will be how a change in the current-limit value produced by a change in the resistance of the wire 17 with temperature is compensated for by the diode groups 21 and 22. Assume an arrangement in which the diode group 21 has X-number (where X is an integer equal to or greater than 1) of parallel-connected diodes constituting one set in which the anodes are connected in common and the cathodes are connected in common, L-number (where L is an integer equal to or greater than 1) of these diode sets being connected serially in the forward direction. Further, assume an arrangement in which the diode group 22 has Y-number (where Y is an integer equal to or greater than 1) of parallel-connected diodes constituting one set in which the anodes are connected in common and the cathodes are connected in common, L-number of these diode sets being connected serially in the forward direction. Furthermore, assume that the current-value ratio of the first current source I1 to the second current source I2 is M:N (where M and N are positive integers). In addition, assume that the resistance value of the wire 17 is R.

When the load current Ia agrees with the output-current limit value, the following equation holds:

$$L \cdot k/q \cdot (T+273) \cdot \ln(M \cdot I/X/Is) - L \cdot k/q \cdot (T+273) \cdot \ln(N \cdot I/Y/Is) \\ = Ia \cdot R \cdot \{1 + tc \cdot (T-25)\} \quad \text{Equation (1)}$$

where k represents the Boltzmann's constant, q the kinetic energy of electrons, T the temperature in degrees Celsius, Is the diode saturation current and tc the temperature coefficient of the metal constituting the wire 17.

If the load current Ia is found from Equation (1), it is represented by the following equation:

$$Ia = L \cdot k/q \cdot (T+273) \cdot \ln(M \cdot Y/N/X)/R/\{1 + tc \cdot (T-25)\} \quad \text{Equation (2)}$$

Since Ia>0 must hold in Equation (2), it is required that M·Y/N/X>1 be satisfied.

If concrete values are applied to Equation (2) and the temperature coefficient of the output-current limit value of the load current Ia is found, the results are as shown in FIGS. 2A to 2C. FIGS. 2A to 2C illustrate examples of cases where the metal constituting the wire 17 is copper, the resistance value of the wire 17 is 1 mΩ and temperature is varied to values of −40° C., 25° C. and 125° C. The settings in FIG. 2A are L=1, M/N=1, Y/X=2, in FIG. 2B they are L=1, M/N=3, Y/X=2, and in FIG. 2C they are L=2, M/N=3, Y/X=2. In all of FIGS. 2A, 2B and 2C, the temperature coefficient of the output-current limit value of the load current Ia when temperature is varied from 25° C. to 125° C. is −0.00041/° C. That is, these results indicate that in a case where temperature is varied by 100° C., the variation in output-current limit value falls within 4%.

Figure 3A:
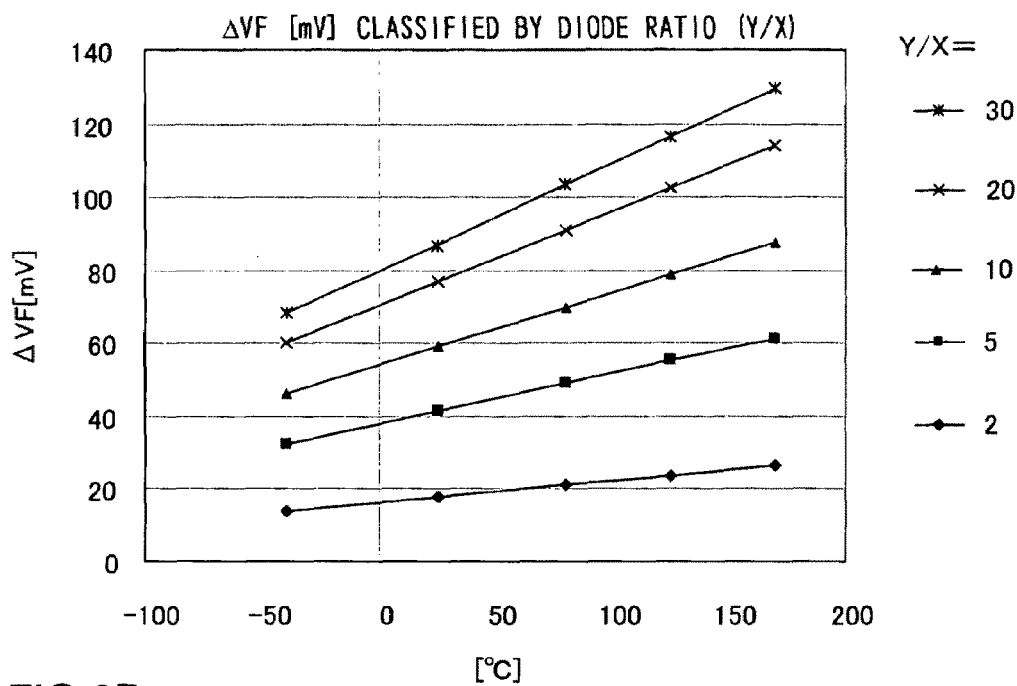
FIGS. 3A and 3B are graphs illustrating a change in potential difference across two diode groups and a change in detected current, respectively, when temperature is varied.
Figure 3B:
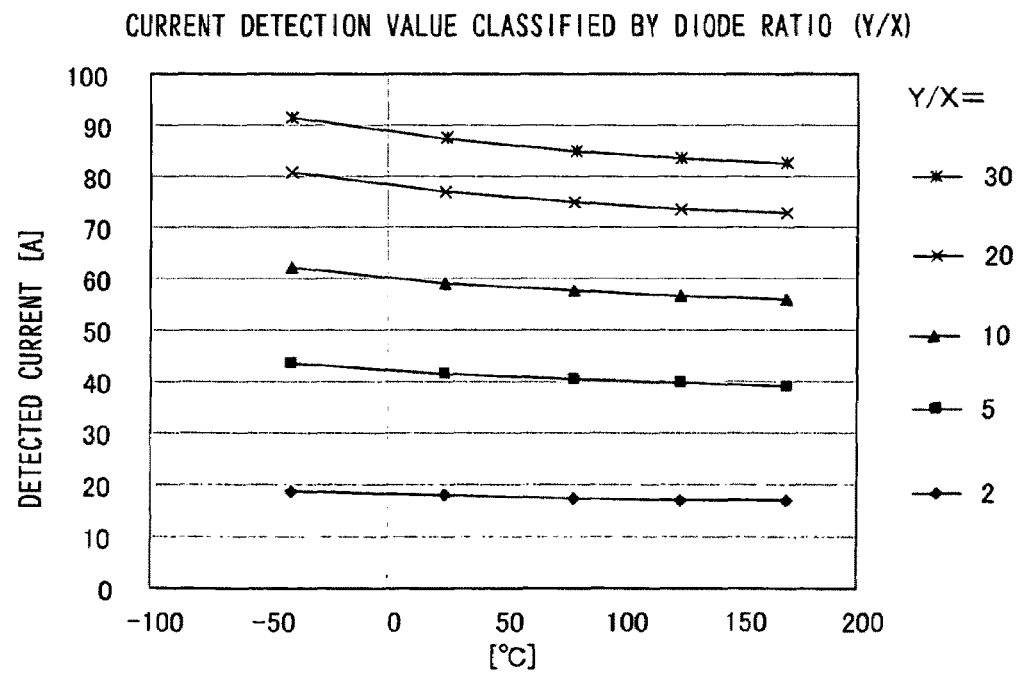

FIG. 3A is a graph illustrating a change in potential difference ΔVF across the diode groups 21, 22 when temperature is varied. FIG. 3B is a graph illustrating a change in detected current (output-current limit value) when temperature is varied. Here L=1, M/N=1 hold and Y/X is varied from 2 to 30. It will be understood that the temperature coefficient of the potential difference across the diode groups 21 and 22 becomes a value close to the temperature coefficient of the copper wire shown in FIG. 6, and that the change in the output-current limit value (detected value) with temperature is kept small, as illustrated in FIG. 3B. Further, it is indicated that in a case where Y/X is varied from 2 to 30, a current detection characteristic having a small temperature coefficient can be adjusted from ten and several amperes to 90 A. It should be noted that although L=1, M/N=1 holds here, it is possible to achieve finer adjustment of the output-current limit value over a wider range by changing L and M/N.

In the description rendered above, the example illustrated is one in which the load 12 is connected between the terminal OUT and ground and the NMOS transistor NM0 functions as a high-side switch. However, it is also possible to adopt an arrangement in which the terminal OUT is grounded, the load 12 is connected between the terminal Vcc and the battery 11 and the NMOS transistor NM0 functions as a low-side switch.

Second Exemplary Embodiment

FIG. 4 is a circuit diagram of an overcurrent detecting circuit according to a second exemplary embodiment of the present invention. Components in FIG. 4 identical with those shown in FIG. 1 are designated by like reference characters and need not be described again. The overcurrent detecting circuit shown in FIG. 4 is obtained by incorporating a current mirror, which comprises NMOS transistors NM1, NM2, in a control circuit 20a in place of the amplifier AMP of FIG. 1.

The MOS transistor NM1 has a source connected to the anode side of the diode group 21, and a drain and gate connected to the current source I1. The MOS transistor MN2 has a source connected to the anode side of the diode group 21, a drain connected to the current source I2 and a gate connected to the gate of the MOS transistor NM1. The NMOS transistor NM3 has its gate connected to the drain of the MOS transistor NM2, its source connected to the second end (point A) of the wire 17 and its drain connected to the gate (control end) of the NMOS transistor NM0. It should be noted that the arrangement is such that the size ratio between the NMOS transistors MN1 and MN2 will agree with the current ratio between the current sources I1 and I2.

In a case where the value of the load current Ia is within a normal range in the semiconductor device constructed as set forth above, the potential difference across the ends (points A and B) of the wire 17 is small and the potential at the first ends (anode side) of the diode group 22, namely the potential at the source of the NMOS transistor NM2, is lower than the potential at the first ends (anode side) of the diode group 21, namely the potential at the source of the NMOS transistor NM1. Accordingly, the NMOS transistor NM2 turns on and the potential at the gate of the NMOS transistor NM3 declines. Consequently, the NMOS transistor NM3 turns off and operation of the NMOS transistor NM0 is unaffected. It should be noted that the size of the NMOS transistor NM3 is set in such a manner that the NMOS transistor NM3 will not be turned on by the turned-on NMOS transistor NM2 and voltage drop of the diode group 22.

On the other hand, if the load current Ia exceeds an output-current limit value, the potential difference across the ends (points A and B) of the wire 17 will exceed a prescribed value. In this case, the first end (anode side) of the diode group 22 becomes higher than the potential at the first end (anode side) of the diode group 21 and the NMOS transistor NM2 turns off. Accordingly, the potential at the gate of the NMOS transistor NM3 rises owing to current that flows out of the current source 12. As a result, the potential difference across the gate and source of the NMOS transistor NM3 increases, the potential at the drain of the NMOS transistor NM3, namely the potential at the gate of the NMOS transistor NM0, falls and the load current Ia that flows through the NMOS transistor NM0 is limited.

In accordance with the overcurrent detecting circuit set forth above, overcurrent can be detected by a simply constructed circuit and a change in the output-current limit value (detected current) with temperature is kept low.

Third exemplary Embodiment

Figure 5:
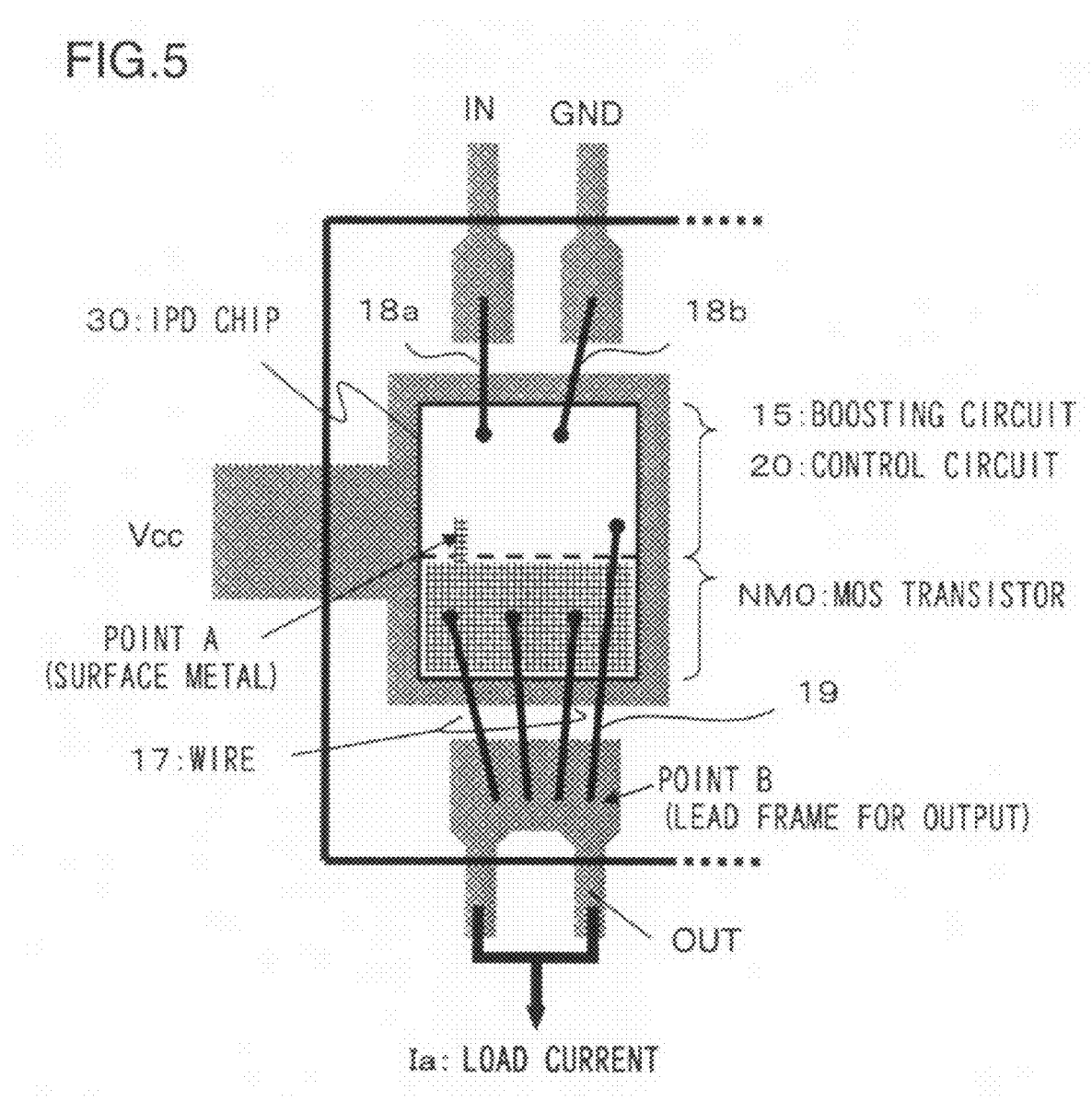
FIG. 5 is a diagram illustrating the structure of a semiconductor device according to a third exemplary embodiment of the present invention.

FIG. 5 is a diagram illustrating the structure of a semiconductor device according to a third exemplary embodiment of the present invention. Components in FIG. 5 identical with those shown in FIG. 1 are designated by like reference characters. The semiconductor device illustrated in FIG. 5 has an IPD chip 30, terminals Vcc, In, GND and OUT, and wires 17, 18a, 18b, 19. The IPD chip 30, which is placed on a lead frame to which the terminal Vcc is connected, has the NMOS transistor NM0, boosting circuit 15 and control circuit 20, etc.

The placed components such as the boosting circuit 15 and control circuit 20 are connected to the terminals IN and GND by the wires (bonding wires) 18a and 18b, respectively, they are wired to the NMOS transistor NM0 by a surface metal (which corresponds to point A) and are connected to the lead frame, which is the terminal OUT, by the wire (bonding wire) 19. Further, the NMOS transistor NM0 has its drain connected to the terminal Vcc (the lead frame on which the IPD chip 30 is mounted), its source connected by the wire 17 to the lead frame serving as the terminal OUT, and its drain wired to the control circuit 20 by wiring (not shown).

It is preferred that the wire 17 be a bonding wire consisting of a metal such as copper, silver, gold or aluminum or an alloy having at least one of these metals as a main component. Further, it is preferred that the diode groups 21, 22 in the control circuit 20 be placed close to the wire 17 so as to diminish the temperature difference between diode groups 21, 22 and the wire 17, although this is not illustrated.

In accordance with the semiconductor device having the structure set forth above, the temperature difference between the diode groups 21, 22 and the wire 17 is small and the temperature coefficient at the potential difference across the two diode groups is the same as the temperature coefficient of the electrical resistivity of the wire 17. By utilizing this fact, the detected voltage of the output-current limit value is corrected so as to reduce the change in output-current limit value.

In this semiconductor device, a variation in the resistance value R of the bonding wire 17 is ascribable to a variation in material, diameter and length of the wire. An example of such variation is roughly ±5% at 3σ (where σ represents a standard deviation). Further, the potential difference ΔVF across the diode groups is a relative value and exhibits a small variation.

An example of such variation is roughly ±3% at 3σ. That is, the precision of the resistance value and the precision of the reference voltage value are high and the precision of current detection is excellent.

Figure 6:
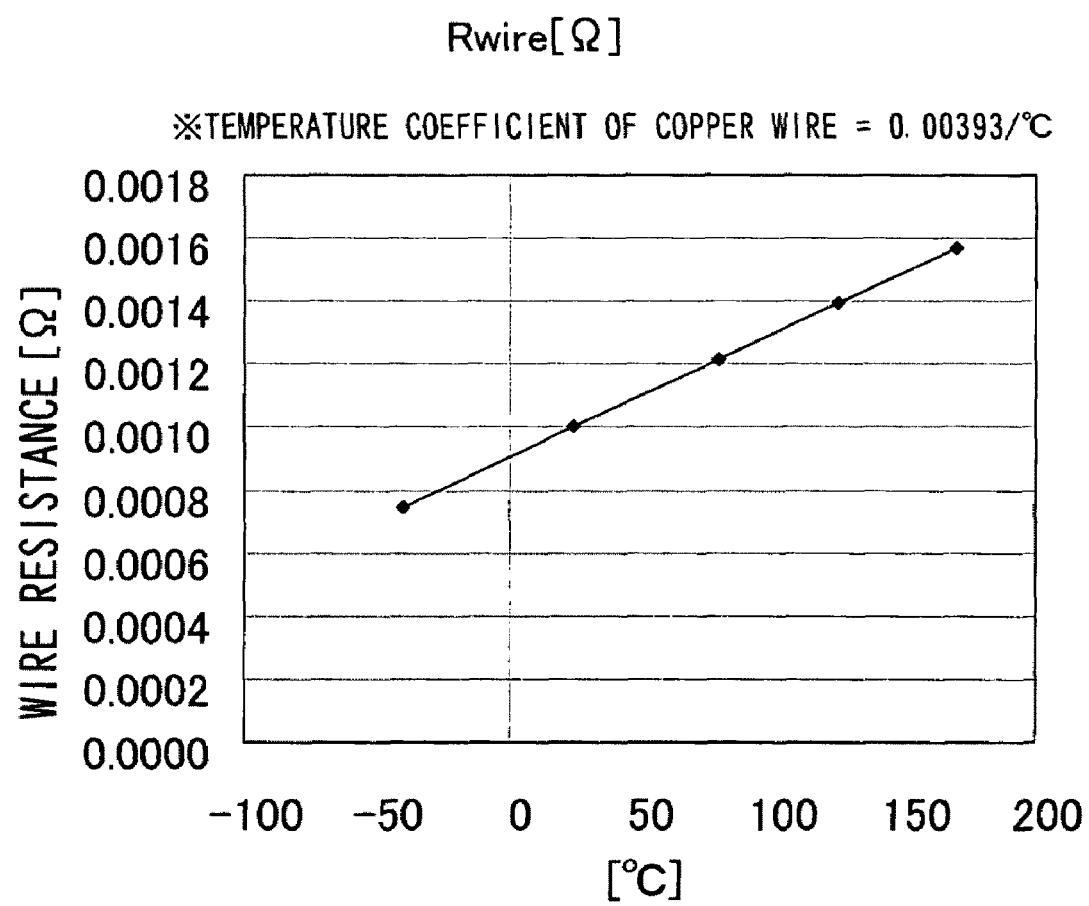
FIG. 6 is a diagram illustrating an example of a change in the resistance of copper wire with a change in temperature.

Further, the temperature coefficient of the potential difference ΔVF is 0.00336 (/° C.) irrespective of X and Y illustrated earlier, and the graph of the temperature characteristic is as depicted in FIG. 3A illustrated earlier. On the other hand, the temperature coefficient (rate of increase per 1° C.) of the resistance value R of the bonding wire is decided by the wire material. For example, the temperature coefficient in the case of a copper (Cu) wire is 0.00393 (/° C.), and the graph of the temperature characteristic is as depicted in FIG. 6 illustrated earlier. Further, the resistance temperature coefficients of silver, gold and aluminum are 0.0038 (/° C.), 0.0034 (/° C.) and 0.0039 (/° C.), respectively. These are approximately the same as the resistance temperature coefficient of copper and are close to the temperature coefficient of the potential difference ΔVF.

Assume that if temperature rises from 25° C. to 125° C., the potential difference ΔVF varies by +33.6% and the resistance value of the Cu wire varies by +39.3%. The result of temperature compensation for these changes is as follows: For the curve Y/X=2, if detected current value=17.8 A at 25° C., then the value is 17.1 A (a factor of 0.959) at 125° C. and the temperature characteristic graph becomes as shown in FIG. 3B mentioned earlier. Here it will be understood that a current detection characteristic having a small temperature coefficient of −0.0041(/° C.) is obtained. Furthermore, in a case where the diode ratio (Y/X) is varied from 2 to 30 with respect to a wire having a resistance value of 1 mΩ at 25° C., a current detection characteristic having a small temperature coefficient is similarly obtained. That is, it will be appreciated that adjustment from ten and several amperes to 90 A is possible.

The semiconductor device described above is ideal for use as a vehicle-mounted high-side switch and furnishes a highly precise temperature compensation in an overcurrent detecting circuit.

Though the present invention has been described in accordance with the foregoing embodiments, the invention is not limited to these embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An overcurrent detecting circuit comprising:
   an output terminal;
   an output transistor that passes an output current into a load via said output terminal;
   a metal wire connected to said transistor and through which the output current flows; and
   a control circuit that detects a potential difference, which is produced across said metal wire owing to the output current that flows into said metal wire and the resistance of said metal wire, and that controls said transistor so as to limit the output current if the potential difference exceeds a prescribed value;
   wherein said control circuit includes:
   first and second current sources;
   a first diode group having a first end from which a first current is passed in a forward direction by said first current source and a second end connected to a first end of said metal wire; and
   a second diode group having a first end from which a second current is passed in a forward direction by said second current source and a second end connected to a second end of said metal wire;
   the prescribed value being corrected based upon a potential difference across the first end of said first diode group and the first end of said second diode group so as to reduce a change in output-current limit value ascribable to a change in resistance of said metal wire with temperature.

2. The circuit according to claim 1, wherein said first diode group has X-number, where X is an integer equal to or greater than 1, of parallel-connected diodes constituting one first set in which anodes are connected in common and cathodes are connected in common, with L-number, where L is an integer equal to or greater than 1, of the first diode sets being connected serially in a forward direction;
   said second diode group has Y-number, where Y is an integer equal to or greater than 1, of parallel-connected diodes constituting one second set in which anodes are connected in parallel and cathodes are connected in parallel, with L-number, where L is an integer equal to or greater than 1, of the second diode sets being connected serially in a forward direction; and
   it is so arranged that M·Y/N/X>1 is satisfied, where a potential at the second end of said metal wire is higher than a potential at a first end of said metal wire, and the current-value ratio of said first current source to said second current source is M:N, where M and N are positive integers.

3. The circuit according to claim 2, wherein said control circuit includes:
   a first MOS transistor having a source, which is connected to an anode end of said first diode group, and a drain and gate connected to said first current source;
   a second MOS transistor having a source connected to an anode end of said second diode group, a drain connected to said second current source and a gate connected to the gate of said first MOS transistor; and
   a third MOS transistor having a gate connected to the drain of said second MOS transistor, a source connected to one of the first and second end of said metal wire and a drain connected to a control end of said output transistor; and
   said first, second and third MOS transistors are of the same conductivity type, and said third MOS transistor controls said output transistor so as to limit the output current if the potential difference exceeds the prescribed value.

4. The circuit according to claim 1, wherein said output transistor is an NMOS transistor that functions as one of a high-side switch and a low-side switch.

5. A semiconductor device that includes the overcurrent detecting circuit set forth in claim 1.

6. The device according to claim 5, wherein said first and second diode groups are placed close to said metal wire.

7. The device according to claim 5, wherein said metal wire is a bonding wire selected from a group consisting of copper, silver, gold, aluminum and an alloy having at least one of these metals as a main component.

* * * * *